United States Patent

Matsushima et al.

Patent Number: 5,138,187
Date of Patent: Aug. 11, 1992

[54] AMPLITUDE VARIABLE PULSE GENERATING CIRCUIT

[75] Inventors: Tetsuya Matsushima, Kawasaki; Yutaka Fukui, Yokohama; Keiichi Murakami, Kawasaki; Hajime Hayashi, Yamato, all of Japan

[73] Assignee: Fujitsu Limited, Kawasaki, Japan

[21] Appl. No.: 382,313

[22] Filed: Jul. 20, 1989

[30] Foreign Application Priority Data

Aug. 3, 1988 [JP] Japan ................ 63-195095

[51] Int. Cl.$^5$ .......................... H03L 5/00; H03K 3/01; H03K 5/08; H03K 17/00
[52] U.S. Cl. .................. 307/264; 307/268; 307/270; 307/571; 328/53; 328/72
[58] Field of Search .......... 307/264, 268, 270, 571, 307/260, 263; 328/34, 58, 114, 53, 72; 367/155

[56] References Cited

U.S. PATENT DOCUMENTS 4,710,654 12/1987 Saitoh et al. .................. 307/268

FOREIGN PATENT DOCUMENTS 59-12620 1/1984 Japan .
59-15327 1/1984 Japan .
62-281929 12/1987 Japan .

*Primary Examiner*—Stanley D. Miller
*Assistant Examiner*—Trong Phan
*Attorney, Agent, or Firm*—Staas & Halsey

[57] ABSTRACT

An amplitude variable pulse generator is provided with two voltage supply sources. The first voltage source supplies a variable voltage which determines the amplitude of the output pulse. The second voltage source is a fixed or constant voltage source which provides a voltage lower in value than the first voltage. The second voltage source quickly pulls up a voltage between a drain and a source of a switching MOSFET, which generates the output pulse, by providing a charging voltage for an output capacitance of the MOSFET. By doing so, the output capacitance of the MOSFET is quickly reduced, and the trailing edge of the output pulse is not rounded even when the variable voltage is low. As a result, the waveform of the output pulse is not rounded for a very small amplitude pulse. Resolution of a supersonic wave device especially a supersonic diagnostic device is thereby improved.

17 Claims, 2 Drawing Sheets

AMPLITUDE VARIABLE PULSE GENERATING CIRCUIT

BACKGROUND OF THE INVENTION

1. Field of the Invention

The present invention relates to a pulse generating circuit in which the amplitude of the output pulse is variable. The present invention is particularly applicable to a supersonic pulse wave generator used for a medical diagnosis device, flaw detector, sonar and the like and is also applicable to other devices using amplitude variable pulses.

2. Description of the Related Art

Supersonic diagnosis equipment is provided with a scanning head which radiates a supersonic wave and detects the wave reflected from various parts of the object. The head is provided with a vibrator which transmits the supersonic wave when supplied with an electric driving pulse. The head is typically provided with a plurality of vibrators each driven independently to form a supersonic wave beam which allows the beam to be scanned or focused at a desired point. A pulse generator, for driving each supersonic vibrator, is required which has the capability of varying the amplitude of the output driving pulse provided to the corresponding vibrator. Supersonic wave generators for devices such as flaw detectors, sonar, and the like need similar driving pulse amplitude control capability.

FIG. 1 is a block diagram of a typical prior art supersonic pulse generator using a piezoelectric vibrator. A central processing unit (CPU) 1, which controls the overall operation of the device, sends out a timing pulse 2 to a pulse generator 3, which outputs a driving pulse 4 to drive a piezoelectric vibrator 5. The CPU 1 also controls a variable voltage source 6 which supplies a voltage to the pulse generator 3. The amplitude of the driving pulse 4 is varied by the voltage supplied to the pulse generator 3 from the variable voltage source 6. The piezoelectric vibrator 5 outputs a supersonic wave, the shape of which is determined by the size and cutting or shape of the piezoelectric element. The amplitude of the supersonic wave is proportional to the amplitude of the driving pulse 4, and hence it is proportional to the output voltage of the variable voltage source 6.

FIG. 2(a) is a prior art pulse generating circuit used for the supersonic wave generator 6 of FIG. 1. An amplifier 7 supplies an amplified pulse to a switching element 8 which turns on and off responsive to the input signal voltage. Usually, a MOSFET (metal oxide semiconductor type field effect transistor) is used as the switching element 8 of FIG. 2(a), however, the switching element 8 may be any other type of device such as bipolar transistor, even though it is more practical to use a MOSFET with respect to cost, size and speed of operation. The piezoelectric vibrator 5 may be any type, such as a magnetostrictive type vibrator. The MOSFET 8 turns on or off state depending on the voltage applied to the gate G. The drain D is connected to a voltage source $V_{D1}$ via a resistor 9, while the source S of the MOSFET 8 is grounded. A bipolar transistor 10 is connected between the voltage source $V_{D1}$ and the piezoelectric vibrator 5. The collector of the bipolar transistor 10 is connected to the voltage source $V_{D1}$, and the base is connected to the drain D of the MOSFET 8. A diode 11 is connected between the emitter and base of the bipolar transistor 10 to supply a current in a direction from the emitter of the transistor 10 to the drain D of the MOSFET 8. A capacitor 12 is connected between the emitter of the bipolar transistor 10 and one end of the piezoelectric vibrator 5, while the other end of the piezoelectric vibrator 5 is grounded.

During operation, first, the capacitor 12 is charged up to the voltage of the voltage source $V_{D1}$ through the bipolar transistor 10. When a timing pulse as in FIG. 2(b) is fed to the amplifier 7, it outputs an amplified pulse where the polarity of the output pulse of the amplifier 7 is inverted as shown in FIG. 2(c), and the amplitude of the pulse is substantially equal to the supply voltage $V_{cc}$ of the amplifier 7. This output pulse is fed to the gate G of the MOSFET 8, and it turns the MOSFET 8 on. As a result, the charge in the capacitor 12 is discharged to ground through diode 11 and MOSFET 8. This discharge causes the voltage at one end of the piezoelectric vibrator 5 to drop as shown in FIG. 2(d). At the trailing edge of the pulse, the gate voltage of the MOSFET 8 is pulled down as shown in FIG. 2(c), and the MOSFET 8 turns off. As a consequence, the capacitor 12 is again charged from the voltage source $V_{D1}$ through the bipolar transistor 10. This makes the voltage applied to the piezoelectric vibrator 5 rise as shown in FIG. 2(d). In this way, a voltage pulse is applied to the piezoelectric vibrator 5. The amplitude of the pulse appearing on one end of the piezoelectric vibrator 5 is substantially equal to the voltage of the voltage source $V_{D1}$, and if the voltage of $V_{D1}$ is varied, the amplitude of the output pulse varies.

A problem occurs when the voltage $V_{D1}$ is decreased to generate a very low supersonic wave pulse. When the voltage of the voltage source $V_{D1}$ is low, the output pulse of the MOSFET 8 is disadvantageously rounded as shown in FIG. 2(e). The rounding occurs especially at the trailing edge of the pulse. Accordingly, if it is necessary to supply the piezoelectric vibrator 5 with low amplitude but very fast repeating pulses, the trailing edge of the preceding pulse will be superposed on the rising edge of the succeeding pulse. This decreases the resolution of the supersonic diagnosis equipment when, for example, a scan of an organ which is located very close to the surface of a human body occurs.

The above description is a general description of the operation of recent supersonic wave diagnosis equipment. A further description of which can be obtained from for example, Japanese Laid Open Patents:

59-12620 "Pulse Amplifier Circuit" by T. Kawada et al., Jan. 23, 1984;

59-15327 "Pulse Amplifier Circuit" by T Kawada et al., Jan. 26, 1984; or 62-281929 "Supersonic Diagnosis Equipment" by N. Norichika et al., Dec. 7, 1987.

SUMMARY OF THE INVENTION

An object of the present invention is to provide a pulse generating circuit which can vary the amplitude of an output pulse without rounding the waveform even for a very low output pulse.

Another object of the present invention is to provide a supersonic pulse generator in which the output wave can be varied in amplitude without distorting the waveform.

Still other object of the present invention is to improve the resolution of supersonic equipment for detecting an object located very close to the detector head.

A further object is to provide a pulse generator that can provide rapidly repeating pulses of low amplitude without distortion or resolution degradation.

A cause of the rounding of the pulse waveform is thought to be due to an increase in output capacitance of the switching element which is used for generating the pulse. Such behavior is especially pronounced when a MOSFET is used as the switching element. According to the present invention, two voltage sources are used. The first voltage source is a variable voltage source which regulates the peak voltage of the output pulse. The second voltage source is used to charge the output capacitance of the MOSFET and to pull the drain voltage up to a voltage at which the output capacitance of the MOSFET becomes small. The voltage of the second voltage source is a fixed voltage, and is set at a lower value than that of the first voltage. The circuit of the present invention is also provided with current control means for preventing current flow from the first voltage source to the second voltage source. The current control means also makes current flow from the second voltage source to the drain of the MOSFET to pull the drain voltage up as quickly as possible. These circuit elements quickly pull up the voltage between the drain and the source of the MOSFET, and the output capacitance of the MOSFET is decreased to a small value, even if the voltage of the pulse amplitude voltage source is decreased. As a result, the waveform at the trailing edge of the output pulse becomes sharp even if the output voltage is decreased to a very low voltage. Accordingly, the problem of overlapping a preceding pulse with a succeeding pulse is avoided, and the resolution of the supersonic equipment is improved.

These and other objects and advantages of the present invention will become more apparent from the following description, reference being had to the accompanied drawings wherein preferred embodiments of the present invention are clearly shown and similar or same reference numerals or characters designate the same or corresponding parts.

DESCRIPTION OF THE PREFERRED EMBODIMENTS

Figure 1:
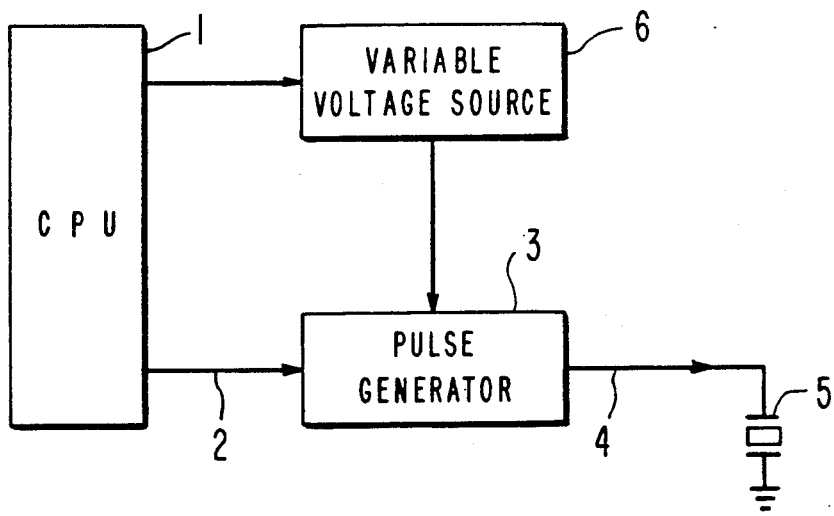
FIG. 1 is a block diagram of a prior pulse generating circuit illustrating overall operation.
Figure 2A:
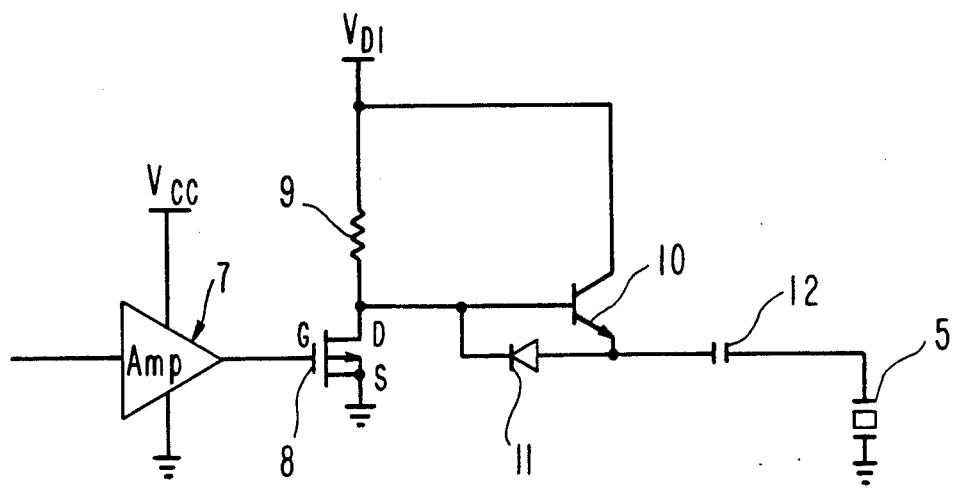
FIG. 2(a) is a circuit diagram of a prior art pulse generating circuit.
Figure 2B:
FIGS. 2(b) through 2(e) show waveforms at various points in the circuit of FIG. 2(a)
Figure 2C:
Figure 2D:
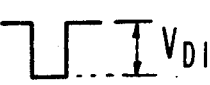
Figure 2E:
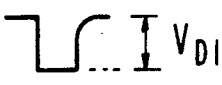
Figure 3:
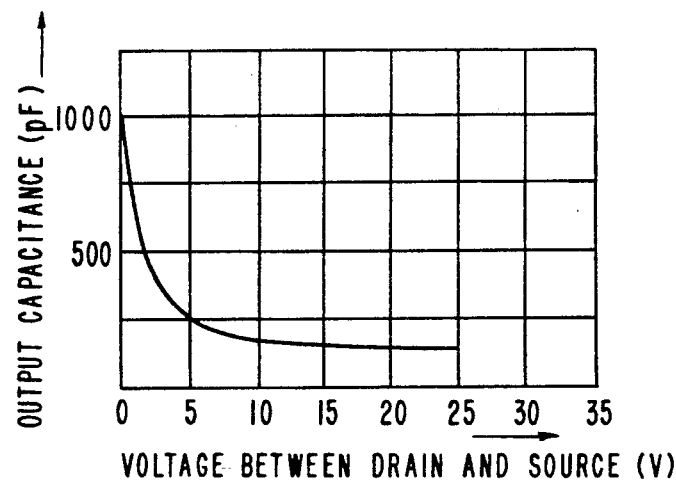
FIG. 3 is a curve showing the dependency of the output capacitance of a MOSFET on the applied voltage between drain and source.

First, the reasons why the output pulse, especially the trailing edge is rounded when the voltage supplied to the pulse generating circuit is low will be explained. The cause of this problem is believed to be an inherent characteristic of a MOSFET. It is known in the art that the output capacitance of a MOSFET becomes very large when the applied voltage between drain and source is small. FIG. 3 illustrates, the dependency of the output capacitance of a MOSFET on the applied voltage between drain and source. As can be seen from the FIG. 3 when the voltage between the drain and source is below 10 volts and especially below 5 volts the capacitance is large and when the voltage is above 10 volts the capacitance is relatively small. Turning back to FIG. 2(a), the voltage between the drain D and the source S of the MOSFET 8 is supplied from the voltage source $V_{D1}$. Therefore, when the MOSFET 8 is switched on, the voltage between the drain and source becomes very low, and the output capacitance becomes very large. Consider now the trailing edge of the output pulse where the gate voltage becomes low (see FIG. 2(c)), the MOSFET 8 turns off and the capacitor 12 begins to be charged by the current from the voltage source $V_{D1}$ through the bipolar transistor 10 and the resistor 9. At the same time the output capacitance of the MOSFET 8 must be charged through the resistor 9. Since the voltage between the drain and source is low, the time constant for charging the large output capacitance is very long. As a result, voltage buildup by the drain D is very slow, and until the drain voltage builds up to a sufficient voltage, the bipolar transistor 10 is also off. Accordingly, the voltage build up by the capacitor 12 becomes rounded as shown in FIG. 2(e). In addition, when the voltage of the voltage source $V_{D1}$ is decreased to reduce the output pulse voltage, the charging of the output capacitance of the MOSFET 8 becomes even slower. These effects cause the trailing edge of the output pulse to have a very long tail, especially when the output pulse voltage is reduced. For example, for an input pulse having a width of 140 ns, the output pulse will have a tail extending as long as 300 ns. If a succeeding pulse is generated within 200 ns of the preceding pulse, for example, the leading edge of the succeeding pulse will overlap the tail of the preceding pulse, and the resolution of the scanning device is reduced. When the voltage of the voltage source $V_{D1}$ is high, this problem does not occur, because the output capacitance of the MOSFET 8 is small, and the time constant is short. This lack of resolution is a defect in supersonic devices discovered very recently, because the need for studying an object located very close to the surface of a human body has arisen very recently.

Figure 4:
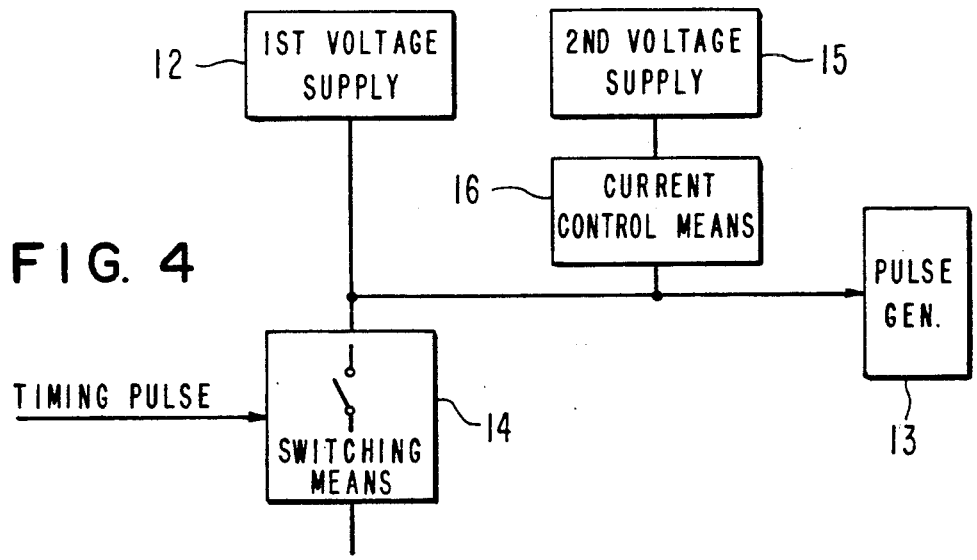
FIG. 4 is a block diagram of a pulse generating circuit according to the present invention.

FIG. 4 is a block diagram illustrating the general operation of a supersonic pulse generating system according to the present invention. First voltage supply means 12 supplies a first variable voltage $V_{D1}$ to a pulse generating means 13. Based on the supplied voltage, the pulse generating means 13 outputs a supersonic pulse wave. Switching means 14 performs an on and off operation under control of a timing pulse. Second voltage supply means 15 supplies a second voltage $V_{D2}$ for quickly pulling up the voltage of the switching means 14. Another feature of the pulse generating system of the present invention is current control means 16 provided between the second voltage supply means 15 and the switching means 14 and which prevents current flow from the first voltage supply means 12 to the second voltage supply means 15 and allows current flow from the second voltage supply means 15 to the switching means 14.

Figure 5:
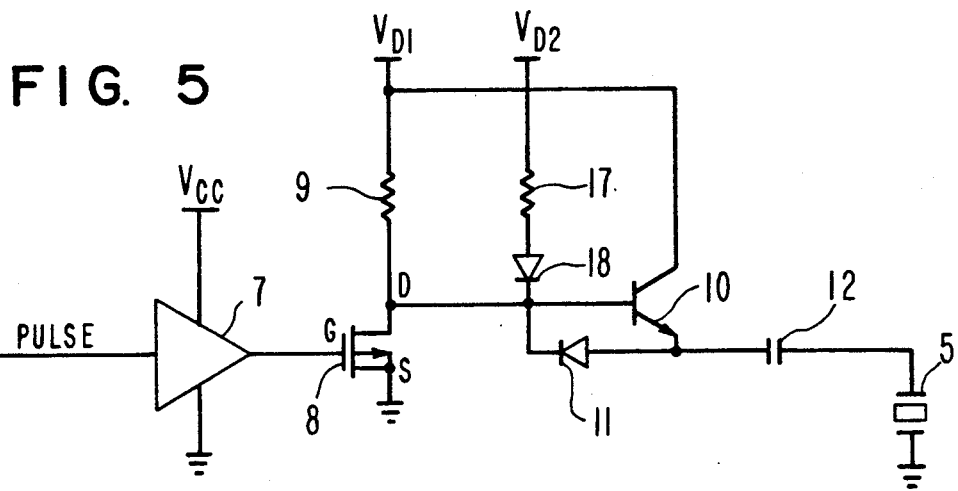
FIG. 5 is a circuit diagram of a pulse generating circuit embodying the present invention.

A circuit diagram for an embodiment of the present invention is shown in FIG. 5. During operation a timing pulse is supplied to an amplifier 7 which is supplied with a voltage from a voltage source $V_{cc}$. The output pulse of the amplifier 7 is fed to the gate G of a MOSFET 8, which corresponds to the switching means 14 of FIG. 4. The drain D of the MOSFET 8 is connected to a first voltage source $V_{D1}$ via a first resistor 9, while the source S of the MOSFET 8 is grounded. The resistance of the first resistor 9 is 200 ohms, for example. The first resistor 9 restricts the current flow from the first voltage source $V_{D1}$, which is 150 v, for example, to the ground through the MOSFET 8 when it is on.

A bipolar transistor 10 is connected between the first voltage source $V_{D1}$ and a piezoelectric vibrator 5. The collector of the bipolar transistor 10 is connected to the first voltage source $V_{D1}$ and the base is connected to the drain D of the MOSFET 8. A diode 11 is connected between the emitter and base of the bipolar transistor 10 to produce a current in a direction from the emitter of transistor 10 to the drain D of the MOSFET 8. A capacitor 12 is connected between the emitter of the bipolar transistor 10 and one end of the piezoelectric vibrator 5, while the other end of the piezoelectric vibrator 5 is grounded. The capacitance of the capacitor 12 is 0.01 $\mu$F, for example. The value of the capacitance is not critical, as long as it is large compared to the capacitance of the piezoelectric vibrator 5. The capacitor 12 isolates the piezoelectric element 5 from a DC voltage of the voltage supply source $V_{D1}$. It will be apparent that the circuit configuration described above is similar to that of FIG. 2(a) which is a prior art pulse generating circuit. However, the present invention is provided with a second voltage source $V_{D2}$ which is connected to the drain D of the MOSFET 8, via a second resistor 17 and a second diode 18. The purpose of providing these circuit elements is to pull the trailing edge of the pulse up very rapidly, and to prevent the rounding of the output pulse. As has been discussed before with respect to FIG. 2(a) and FIG. 3, the trailing edge of the output pulse in the prior art is rounded especially when the voltage of $V_{D1}$ is low.

While the gate voltage of the MOSFET 8 is high and the MOSFET 8 is on, the voltage between the drain D and source S is very low, and the output capacitance of the MOSFET 8 is very large as can be seen in FIG. 3. When the gate voltage of the MOSFET 8 is pulled down and the MOSFET 8 turns off, the drain voltage is quickly pulled up by the second voltage source $V_{D2}$ resulting in the output capacitance of the MOSFET 8 being rapidly reduced to a small value, and the rounding of the trailing edge of the output pulse is avoided.

It will be apparent from FIG. 3, that when the drain voltage goes up to 5-10 volts, the output capacitance becomes very small and a further increase in the drain voltage does not significantly contribute to a decrease in the output capacitance. Therefore, the voltage of the second voltage source $V_{D2}$ need not be too high. About 5-10 volts is sufficient. The second resistor 17 is designed to prevent too large a current from flowing from the second voltage source $V_{D2}$ to ground through the MOSFET 8. The smaller the resistance of the second resistance 17 the better from the view point of a rapid build up in the drain voltage. In a practical sense the resistance of the second resistor 17 is determined by a compromise between the need for a rapid build up of the trailing edge and the power saving associated with the second voltage source $V_{D2}$. In preferred embodiment, the resistance of the second resistor 17 is 30 ohms.

Since the voltage of the second source $V_{D2}$ is lower than that of the first voltage source $V_{D1}$, a current may flow from the first voltage source $V_{D1}$ to the second voltage source $V_{D2}$. To prevent this current flow, a second diode 18 is provided between the second resistor 17 and the drain D of the MOSFET 8. The second diode 18 operates as a current controller which prevents a reverse flow of current from $V_{D1}$ to $V_{D2}$ while allowing the charging current to flow from the second voltage source $V_{D2}$ to the drain D of the MOSFET 8, when the MOSFET 8 is switched from on to off.

As mentioned before, the shape of the trailing edge of the output pulse is determined by the time constant of the voltage build up at the drain D of the MOSFET 8. In this invention, the output capacitance is charged up in parallel from the first voltage source $V_{D1}$ and the second voltage source $V_{D2}$, resulting in the time constant being reduced. By providing additional parallel circuits of resistors and diodes the time constant can be further reduced. In the above embodiment, the resistances of the first and the second resistors are respectively 200 and 30 ohms. Therefore, it will be understood that the time constant is reduced to approximately one eighth of the prior art circuit. Accordingly, the tail of the output pulse is also cut down to about one eighth of that of the prior art. As a result, the pulse generator of the present invention can operate at a faster pulse repetition rate, even during at very low amplitude operation.

In the above description, the invention has been described with reference to an ultrasonic diagnosis apparatus. The invention is applicable to any other apparatus using an amplitude variable pulse such as a fault detector, sonar and so on. The disclosure of the circuit has been with respect to a preferred embodiment, but it will be apparent to those skilled in the art that various modifications are possible. For example, the resistors 9 or 17 can be replaced by FETs, the MOSFET 8 may be replaced by other devices such as a bipolar transistor. The second diode 18 may be replaced by other devices such as a bipolar transistor. Accordingly, the examples given here are illustrative and not restrictive, the scope of the invention being indicated by the appended claims, rather than the foregoing description, and all changes which come within the meaning and range of equivalence of the claims are, therefore, to be embraced therein.

We claim:

1. A supersonic pulse wave generating unit, comprising:
    variable voltage source means for producing a variable voltage;
    pulse generator means coupled to said variable voltage source, for producing a pulse with an amplitude varying responsive to the variable voltage;
    means coupled to said pulse generator means, for enhancing a trailing edge of the pulse; and
    a supersonic vibrator coupled to said means for enhancing, for generating a supersonic wave responsive to the pulse enhanced by said means for enhancing.

2. A supersonic pulse wave generating unit as recited in claim 1, wherein said pulse generator means includes an output capacitance and said means for enhancing provides a charging voltage for charging the output capacitance.

3. A supersonic pulse wave generating unit as recited in claim 1, wherein said means for enhancing comprises:
    a constant voltage source providing a constant charging voltage; and
    current control means coupled to the constant voltage source, for providing the charging voltage to said pulse generator and preventing current flow toward said constant voltage source.

4. A supersonic pulse wave generating unit as recited in claim 3, wherein said current control means comprises:
 a resistor connected to said constant voltage source; and
 a diode connected between said resistor and said pulse generator.

5. A supersonic pulse wave generating circuit supplied with an input signal, comprising:
 first voltage supply means for supplying a first voltage;
 switching means coupled to said first voltage supply means, for performing on and off operations corresponding to the input signal and generating a voltage pulse responsive to the on and off operations, said switching means being connected between said first voltage supply means and ground;
 second voltage supply means coupled to said switching means, for supplying a second voltage to said switching means which is lower than said first voltage;
 current control means coupled to said second voltage supply means, for suppressing a current from said first voltage supply means to said second voltage supply means and supplying a current from said second voltage supply means to said switching means; and
 a supersonic vibrator coupled to said current control means, for generating a supersonic wave based on the voltage pulse and the current.

6. A supersonic pulse wave generating circuit as recited in claim 5, wherein said switching means comprises a MOSFET (metal oxide semiconductor field effect transistor).

7. A supersonic pulse wave generating circuit as recited in claim 5, wherein said current control means comprises a diode.

8. A supersonic pulse wave generating circuit as recited in claim 5,
 wherein said first voltage supply means comprises:
  a variable voltage supply source for supplying a variable voltage; and
  a first resistor having a first end connected to said variable voltage source and having a second end;
 wherein said switching means comprises:
  a MOSFET having a drain connected to the second end of said first resistor, a source connected to ground, and a gate receiving the input signal;
  a bipolar transistor having a collector connected to said variable voltage source, a base connected to the drain of said MOSFET and an emitter; and
  a first diode connected between the emitter and base of said bipolar transistor, said first diode connected to supply a current from the emitter of said bipolar transistor to the drain of said MOSFET;
 wherein said second voltage supply means comprises:
  a constant voltage source for supplying a constant voltage, which is lower than said variable voltage; and
  a second resistor having a first end connected to aid second voltage source and having a second end;
 wherein said current control means comprises a second diode connected between the second end of said second resistor and the drain of said MOSFET, said second diode being connected to supply a current from said second voltage source to the drain of said MOSFET; and
 wherein the output voltage pulse is produced at a junction point of the emitter of said bipolar transistor and said first diode.

9. A supersonic pulse wave generator supplied with an input signal, comprising:
 first voltage supply means for supplying a first voltage;
 switching means for performing on and off operations corresponding to the input signal and generating a voltage pulse responsive to the one and off operations, said switching means being coupled between said first voltage supply means and ground;
 second voltage supply means coupled to said switching means, for supplying a second voltage to said switching means which is lower than said first voltage;
 current control means coupled to said second voltage supply means, for suppressing a current from said first voltage supply means to said second voltage supply means and supplying a current from said second voltage supply means to said switching means; and
 a supersonic vibrator coupled to said current control means, for generating a supersonic wave responsive to the voltage pulse from said switching means.

10. A supersonic pulse wave generator as recited in claim 9, wherein said switching means comprises a MOSFET (metal oxide semiconductor field effect transistor).

11. A supersonic pulse wave generator as recited in claim 9, wherein said current control means comprises a diode.

12. A supersonic pulse wave generator as recited in claim 9,
 wherein said first voltage supply means comprises:
  a variable voltage supply source for supplying a variable voltage; and
  a first resistor having a first end connected to said variable voltage source and having a second end;
 wherein said switching means comprises:
  a MOSFET having a drain connected to the second end of said first resistor, a source connected to ground, and a gate receiving the input signal;
  a bipolar transistor having a collector connected to said variable voltage source, a base connected to the drain of said MOSFET and an emitter; and
  a first diode connected between the emitter and base of said bipolar transistor, said first diode connected to supply a current from the emitter of said bipolar transistor to the drain of said MOSFET;
 wherein said second voltage supply means comprises:
  a constant voltage source for supplying a constant voltage, which is lower than said variable voltage; and
  a second resistor having a first end connected to said second voltage source and having a second end;
 wherein said current control means comprises a second diode connected between the second end of said second resistor and the drain of said MOSFET, said second diode being connected to supply a current from said second voltage source to the drain of said MOSFET;
 wherein the output voltage pulse is produced at a junction point of the emitter of said bipolar transistor and said first diode;

said generator further comprising a capacitor having a first end connected to the emitter of said bipolar transistor and having a second end; and wherein said supersonic vibrator has a first end connected to the second end of said capacitor and a second end grounded.

13. A pulse wave generator for receiving an input signal, a first voltage and a second voltage, and for generating a pulse wave responsive to the input signal, the first voltage and the second voltage, comprising:
a MOSFET including a drain terminal, a source terminal and a gate terminal, the gate terminal being for receiving the input signal;
a first resistor including a first end coupled to the drain terminal, and a second end for receiving the first voltage;
a first diode including a first cathode coupled to the drain terminal, and a first anode;
a second resistor including a first end coupled to the first anode, and a second end for receiving the second voltage;
a second diode including a second cathode coupled to the drain terminal, and a second anode;
a bipolar transistor having a base terminal, a collector terminal, and an emitter terminal, the base terminal being coupled to the drain terminal, the emitter terminal being coupled to the second anode, and the collector terminal being for receiving the first voltage; and
a piezoelectric vibrator coupled to the emitter terminal.

14. A pulse wave generator as recited in claim 13, further comprising:
a capacitor coupled between the emitter terminal and the piezoelectric vibrator.

15. A pulse generating unit, comprising:
variable voltage source means for producing a variable voltage;
pulse generator means coupled to said variable voltage source, for producing a pulse with an amplitude varying responsive to the variable voltage; and
means coupled to said pulse generator means, for enhancing a trailing edge of the pulse,
wherein said means for enhancing comprises:
a constant voltage source providing a constant charging voltage; and
current control means coupled to the constant voltage source, for providing the charging voltage to said pulse generator and preventing current flow toward said constant voltage source.

16. A pulse generating unit as recited in claim 15, wherein said current control means comprises:
a resistor connected to said constant voltage source; and
a diode connected between said resistor and said pulse generator.

17. A pulse generating circuit supplied with an input signal, comprising:
first voltage supply means for supplying a first voltage;
switching means coupled to said first voltage supply means, for performing on and off operations corresponding to the input signal and generating a voltage pulse responsive to the on and off operations, said switching means being connected between said first voltage supply means and ground;
second voltage supply means coupled to said switching means, for supplying a second voltage to said switching means which is lower than said first voltage; and
current control means coupled to said second voltage supply means, for suppressing a current from said first voltage supply means to said second voltage supply means and supplying a current from said second voltage supply means to said switching means,
wherein said first voltage supply means comprises:
a variable voltage supply source for supplying a variable voltage; and
a first resistor having a first end connected to said variable voltage source and having a second end;
wherein said switching means comprises:
a MOSFET having a drain connected to the second end of said first resistor, a source connected to ground, and a gate receiving the input signal;
a bipolar transistor having a collector connected to said variable voltage source, a base connected to the drain of said MOSFET and an emitter; and
a first diode connected between the emitter and base of said bipolar transistor, said first diode connected to supply a current from the emitter of said bipolar transistor to the drain of said MOSFET;
wherein said second voltage supply means comprises:
a constant voltage source for supplying a constant voltage, which is lower than said variable voltage; and
a second resistor having a first end connected to said second voltage source and having a second end;
wherein said current control means comprises a second diode connected between the second end of said second resistor and the drain of said MOSFET, said second diode being connected to supply a current from said second voltage source to the drain of said MOSFET; and
wherein the output voltage pulse is produced at a junction point of the emitter of said bipolar transistor and said first diode.

* * * * *

UNITED STATES PATENT AND TRADEMARK OFFICE
CERTIFICATE OF CORRECTION

PATENT NO. : 5,138,187
DATED : August 11, 1992
INVENTOR(S) : Matsushima et al.

It is certified that error appears in the above-identified patent and that said Letters Patent is hereby corrected as shown below:

Column 2, line 51, change "T" to --T.--.

Column 8 (Claim 9), line 10, change

"one" to --on--.

Signed and Sealed this

Twelfth Day of October, 1993

Attest:

BRUCE LEHMAN

Attesting Officer

Commissioner of Patents and Trademarks